United States Patent
Cheong et al.

(10) Patent No.: US 11,126,092 B2
(45) Date of Patent: Sep. 21, 2021

(54) METHODS FOR DETERMINING AN APPROXIMATE VALUE OF A PROCESSING PARAMETER AT WHICH A CHARACTERISTIC OF THE PATTERNING PROCESS HAS A TARGET VALUE

(71) Applicant: ASML NETHERLANDS B.V., Veldhoven (NL)

(72) Inventors: Lin Lee Cheong, San Jose, CA (US); Wenjin Huang, San Jose, CA (US); Bruno La Fontaine, Pleasanton, CA (US)

(73) Assignee: ASML Netherlands B.V., Veldhoven (NL)

( * ) Notice: Subject to any disclaimer, the term of this patent is extended or adjusted under 35 U.S.C. 154(b) by 22 days.

(21) Appl. No.: 15/774,583

(22) PCT Filed: Oct. 7, 2016

(86) PCT No.: PCT/EP2016/074017
§ 371 (c)(1),
(2) Date: May 8, 2018

(87) PCT Pub. No.: WO2017/080729
PCT Pub. Date: May 18, 2017

(65) Prior Publication Data
US 2018/0329311 A1 Nov. 15, 2018

Related U.S. Application Data

(60) Provisional application No. 62/255,191, filed on Nov. 13, 2015.

(51) Int. Cl.
*G03F 7/20* (2006.01)
*G05B 19/4097* (2006.01)

(52) U.S. Cl.
CPC ...... *G03F 7/70625* (2013.01); *G03F 7/70641* (2013.01); *G05B 19/4097* (2013.01); *G05B 2219/45028* (2013.01)

(58) Field of Classification Search
CPC .. G03F 7/705; G03F 7/70625; G03F 7/70641; G03F 7/7065; G03F 1/84;
(Continued)

(56) References Cited

U.S. PATENT DOCUMENTS 6,909,930 B2 * 6/2005 Shishido ........... H01L 21/67276
250/492.2
7,194,704 B2 * 3/2007 Kotani ................ G06F 17/5081
257/E21.024

(Continued)

OTHER PUBLICATIONS

International Search Report and Written Opinion dated May 4, 2017 in corresponding International Patent Application No. PCT/EP2016/074017.

(Continued)

*Primary Examiner* — Helen Rossoshek
(74) *Attorney, Agent, or Firm* — Pillsbury Winthrop Shaw Pittman LLP

(57) ABSTRACT

A method including: determining a value of a characteristic of a patterning process or a product thereof, at a current value of a processing parameter; determining whether a termination criterion is met by the value of the characteristic; if the termination criterion is not met, determining a new value of the processing parameter from the current value of the processing parameter and a prior value of the processing parameter, and setting the current value to the new value and repeating the determining steps; and if the termination criterion is met, providing the current value of the processing parameter as an approximation of a value of the processing parameter at which the characteristic has a target value.

20 Claims, 14 Drawing Sheets

(58) Field of Classification Search
CPC ............. G06F 17/5009; G06F 17/5081; G06F 17/5022; G06F 2217/16; G06F 2119/18; G05B 19/4097; G05B 2219/45028
See application file for complete search history.

(56) References Cited

U.S. PATENT DOCUMENTS

| | | | | |
|---|---|---|---|---|
| 7,352,453 B2 * | 4/2008 | Mieher | ................ | G01N 21/956 356/125 |
| 7,368,208 B1 * | 5/2008 | Adel | ................ | G03F 1/30 257/48 |
| 7,743,359 B2 * | 6/2010 | Sezginer | ................ | G03F 1/36 430/30 |
| 8,045,785 B2 * | 10/2011 | Kitamura | ................ | G06K 9/00 348/125 |
| 8,065,636 B2 * | 11/2011 | Ye | ................ | G03F 7/705 430/5 |
| 8,102,408 B2 * | 1/2012 | Verma | ................ | G03F 1/84 346/87 |
| 8,245,160 B2 * | 8/2012 | Ye | ................ | G03F 7/705 430/5 |
| 8,318,391 B2 * | 11/2012 | Ye | ................ | G03F 1/44 430/5 |
| 8,918,742 B2 * | 12/2014 | Feng | ................ | G03F 7/70483 716/51 |
| 9,490,182 B2 * | 11/2016 | Shchegrov | ................ | H01L 22/12 |
| 9,518,936 B2 | 12/2016 | Grootjans et al. | | |
| 9,990,451 B2 * | 6/2018 | Hunsche | ................ | G06F 17/5009 |
| 10,101,674 B2 * | 10/2018 | Pandev | ................ | G03F 7/70641 |
| 10,310,371 B2 * | 6/2019 | Ye | ................ | G03F 1/144 |
| 10,514,614 B2 * | 12/2019 | Vellanki | ................ | G03F 7/705 |
| 10,520,830 B2 * | 12/2019 | Kicken | ................ | G03F 7/70508 |
| 2010/0162197 A1 * | 6/2010 | Ye | ................ | G03F 1/144 716/53 |
| 2015/0089459 A1 * | 3/2015 | Liu | ................ | G06F 30/398 716/53 |
| 2015/0308966 A1 | 10/2015 | Grootjans et al. | | |
| 2015/0356233 A1 * | 12/2015 | Fouquet | ................ | G06F 17/5081 438/5 |
| 2016/0162623 A1 * | 6/2016 | Lutich | ................ | G03F 1/36 716/51 |
| 2016/0162626 A1 * | 6/2016 | Herrmann | ................ | G06F 17/5081 716/51 |
| 2016/0177449 A1 * | 6/2016 | Ohmori | ................ | H01J 37/32917 427/572 |
| 2017/0160648 A1 * | 6/2017 | Tel | ................ | G03F 7/705 |
| 2017/0285483 A1 * | 10/2017 | Finders | ................ | G03F 7/705 |
| 2017/0315441 A1 * | 11/2017 | Finders | ................ | G03F 1/70 |
| 2018/0012813 A1 * | 1/2018 | Jaschinsky | ................ | G06F 16/245 |
| 2018/0031981 A1 * | 2/2018 | Vellanki | ................ | G03F 7/70525 |
| 2018/0088470 A1 * | 3/2018 | Bhattacharyya | ................ | G01B 11/30 |
| 2018/0252998 A1 * | 9/2018 | Ten Berge | ................ | G03F 1/84 |
| 2018/0259858 A1 * | 9/2018 | Chen | ................ | G03F 7/70558 |
| 2018/0284623 A1 * | 10/2018 | Tel | ................ | G03F 7/70508 |
| 2018/0299770 A1 * | 10/2018 | Ten Berge | ................ | G03F 1/72 |
| 2018/0314149 A1 * | 11/2018 | Mulkens | ................ | G03F 7/7065 |
| 2018/0314168 A1 * | 11/2018 | Van Haren | ................ | G03F 7/70633 |
| 2018/0321596 A1 * | 11/2018 | Wang | ................ | G03F 7/70558 |
| 2018/0322237 A1 * | 11/2018 | Ten Berge | ................ | G03F 1/70 |
| 2019/0006147 A1 * | 1/2019 | Kastrup | ................ | H01J 37/023 |
| 2019/0086810 A1 * | 3/2019 | Tel | ................ | G03F 7/705 |
| 2019/0204750 A1 * | 7/2019 | Wang | ................ | G03F 7/705 |
| 2019/0258169 A1 * | 8/2019 | Wang | ................ | G03F 7/705 |
| 2019/0361358 A1 * | 11/2019 | Tel | ................ | G03F 7/705 |

OTHER PUBLICATIONS

Sachs, E. et al., "Run by run process control: combining SPC and feedback control", IEEE Transactions on Semiconductor Manufacturing, vol. 8, No. 1, pp. 26-43 (1995).

* cited by examiner

METHODS FOR DETERMINING AN APPROXIMATE VALUE OF A PROCESSING PARAMETER AT WHICH A CHARACTERISTIC OF THE PATTERNING PROCESS HAS A TARGET VALUE

CROSS-REFERENCE TO RELATED APPLICATIONS

This application is the U.S. national phase entry of PCT patent application no. PCT/EP2016/074017, which was filed on Oct. 7, 2016, which claims the benefit of priority of U.S. provisional patent application No. 62/255,191, which was filed on Nov. 13, 2015, and which is incorporated herein in its entirety by reference.

FIELD

The present disclosure relates to a method of improving the performance of a manufacturing process. The method may be used in connection with a lithographic apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, ion implantation, etc. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

SUMMARY

Disclosed herein is a method comprising: determining a value of a characteristic of a patterning process or a product thereof, at a current value of a processing parameter; determining whether a termination criterion is met by the value of the characteristic; if the termination criterion is not met, determining, by a computer, a new value of the processing parameter from the current value of the processing parameter and a prior value of the processing parameter, and setting the current value to the new value and repeating the determining steps; and if the termination criterion is met, providing the current value of the processing parameter as an approximation of a value of the processing parameter at which the characteristic has a target value.

According to an embodiment, the method further comprises selecting an initial value of the processing parameter.

According to an embodiment, the target value is a boundary of a process window (PW) or a sub-process window (sub-PW).

According to an embodiment, the termination criterion is that the value of the characteristic at the current value of the processing parameter is within a range from the target value.

According to an embodiment, the new value is determined from the value of the characteristic at the current value of the processing parameter and the value of the characteristic at the prior value of the processing parameter.

According to an embodiment, determining the new value comprises: determining a step of the processing parameter from the current value or the prior value of the processing parameter, and from the value of the characteristic at the current value or at the prior value of the processing parameter; and determining the new value by combining the current value with the step.

According to an embodiment, determining the new value comprises: determining values of the characteristic at the prior value of the processing parameter and at the current value of the processing parameter; and determining the new value by extrapolation or interpolation from the values of the characteristic at the prior value of the processing parameter and at the current value of the processing parameter, and from the target value.

According to an embodiment, determining the new value comprises determining the new value by an affine combination of the prior value of the processing parameter and the current value of the processing parameter.

Disclosed herein is a method comprising: obtaining a value of a processing parameter of a patterning process, wherein at the value of the processing parameter, the patterning process is at a boundary of a process window; obtaining a deviation of the processing parameter; determining a value of an indicator for each of a plurality of patterns, the value of the indicator characterizing a change of a characteristic of each of the patterns within the value of the processing parameter to the value of the processing parameter combined with the deviation; and identifying, by a computer, the patterns having a risk of being defective among the plurality of patterns based on the value of the indicator.

According to an embodiment, the deviation represents a magnitude of variation of values of the processing parameter during the patterning process.

According to an embodiment, the indicator is a difference of a value of the characteristic at the value of the processing parameter combined with the deviation and a value of the characteristic at the value of the processing parameter.

According to an embodiment, the indicator is a derivative of the characteristic with respect to the processing parameter.

According to an embodiment, the indicator is an integral of a product of a change of the processing parameter from the value of the processing parameter combined with the deviation to the value of the processing parameter and a probability of the deviation.

Disclosed herein is a computer program product comprising a computer readable medium having instructions recorded thereon, the instructions when executed by a computer implementing any of the methods herein.

DETAILED DESCRIPTION

Figure 1:
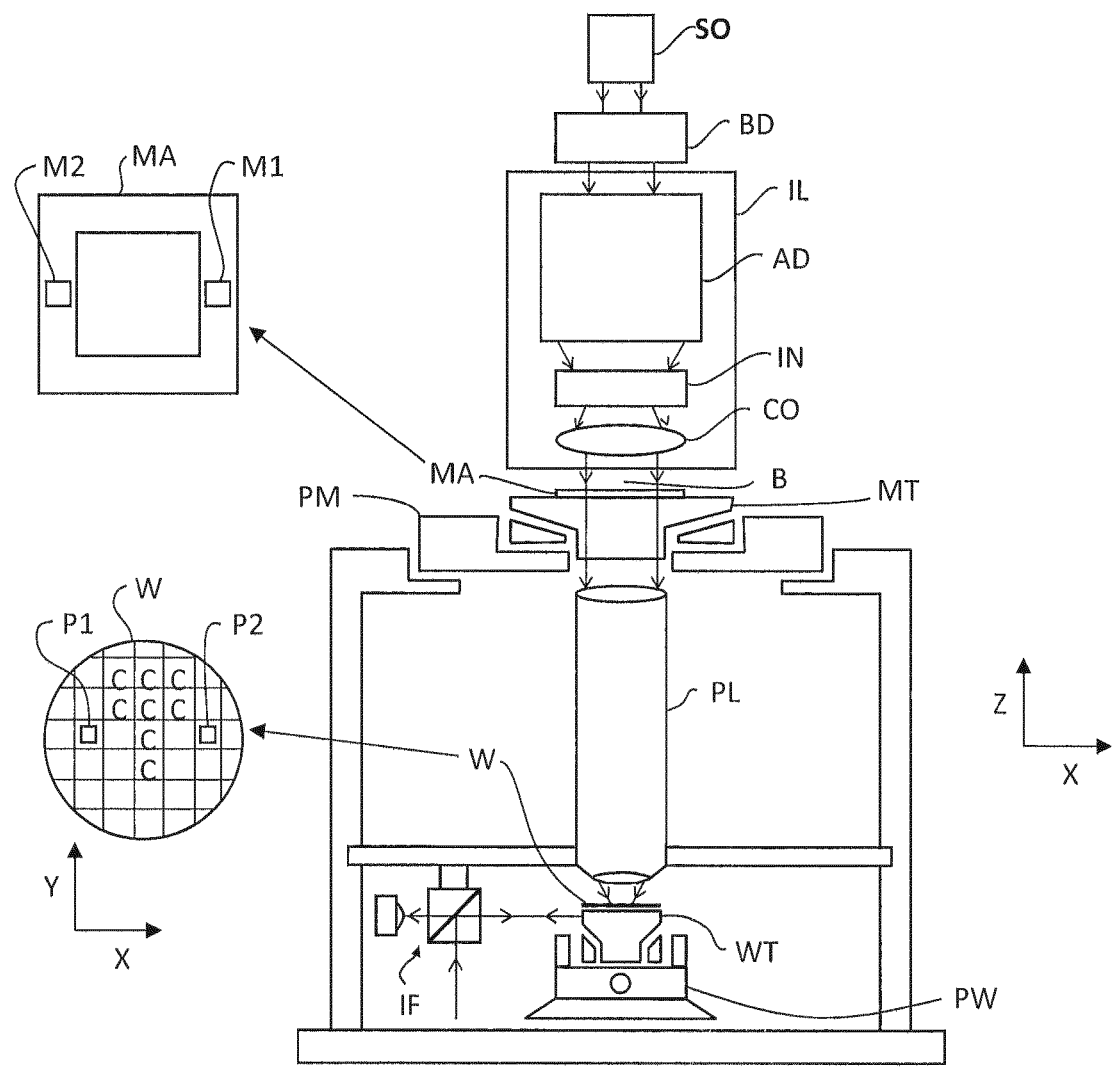
FIG. 1 schematically depicts a lithography apparatus according to an embodiment.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens."

FIG. 1 schematically depicts a lithography apparatus according to an embodiment. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithography apparatus may be separate entities, for example when the source is an excimer laser. In such cases, the source is not considered to form part of the lithography apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The projection system PL has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane). The relative phase of the projection system PL in its pupil plane may be determined by projecting radiation, for example from a point-like source in an object plane of the projection system PL (i.e. the plane of the patterning device MA), through the projection system PL and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PL (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PL of a state of the art lithography apparatus LA may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PL in its pupil plane may be determined by projecting radiation, for example from a point-like source in an object plane of the projection system PL (i.e. the plane of the patterning device MA), through the projection system PL and measuring the intensity of radiation in a plane that is conjugate to a pupil plane of the projection system PL, using a detector. The same detector as is used to measure the wavefront to determine aberrations may be used. The projection system PL may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PL in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PL to correct for apodizations (transmission variation across the pupil plane). The transmission map of a projection system PL may be used when designing a patterning device (e.g., mask) MA for the lithography apparatus LA. Using a computational lithography technique, the patterning device MA may be designed to at least partially correct for apodizations.

Figure 2:
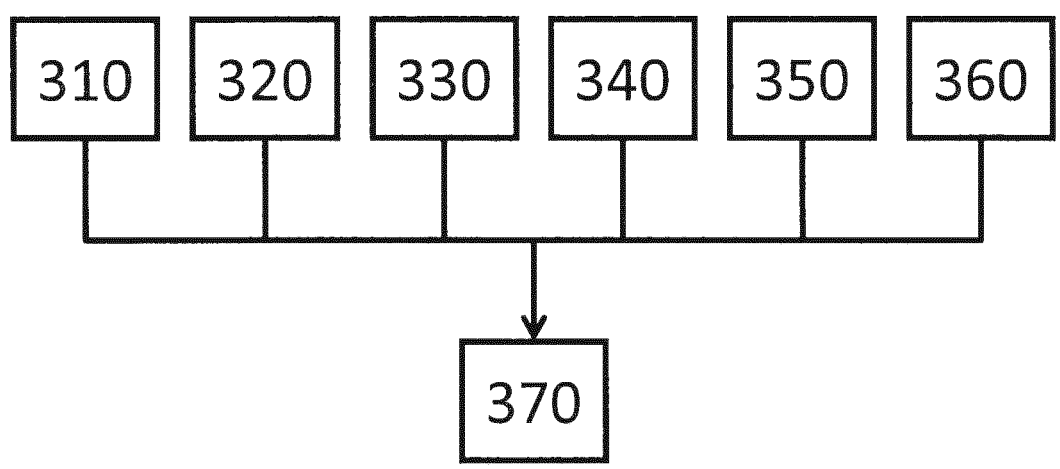
FIG. 2 shows example categories of the processing parameters.

Parameters of the patterning process may be called "processing parameters." The patterning process may include processes upstream and downstream to the actual transfer of the pattern (e.g., exposure). FIG. 2 shows example categories of the processing parameters 370. The first category may be parameters 310 of the lithography apparatus or any other apparatus used in the patterning process. Examples of this category include parameters of the illumination radiation (e.g., spatial or angular distribution intensity), projection optics (e.g., optical aberrations), substrate stage, etc. of a lithography apparatus. The second category may be parameters 320 of any procedures performed in the patterning process. Examples of this category include exposure duration, radiation dose, focus, development temperature, chemical compositions used in development, etc. The third category may be parameters 330 of the design layout. Examples of this category may include shapes and locations of assist features, adjustments applied by a resolution enhancement technique (RET), etc. The fourth category may be parameters 340 of the substrate. Examples include characteristics of structures under a resist layer, chemical composition of a layer on the substrate, physical dimensions of the resist layer, etc. The fifth category may be characteristics 350 of temporal variations of some parameters of the patterning process. For example, the processing parameters may include characteristics of high frequency stage movements (e.g., frequency, amplitude, etc.), high frequency laser bandwidth changes (e.g., frequency, amplitude, etc.), high frequency laser wavelength changes, etc. These high frequency changes or movements are those above the response time of mechanisms to adjust the underlying parameters (e.g., stage position and/or laser intensity). The sixth category may be characteristics 360 downstream to exposure, such as post-exposure bake, development, etching, deposition, doping, packaging, etc.

The values of some or all of the processing parameters may be determined by a suitable method. For example, the values may be determined from data obtained with one or more substrate metrology tools. The values may be obtained from one or more sensors in apparatus of the patterning process (e.g., one or more sensor of the lithography apparatus). The values may be from an operator of the patterning process.

Various patterns on a patterning device may have different process windows (i.e., a space of the processing parameters under which a pattern will be produced within specification). Examples of pattern specification that relate to potential systematic defects include checks for necking, line pull back, line thinning, critical dimension (CD), edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a patterning process, it is possible and economical to focus on the hot spots. When the hot spots are not defective, it is most likely that the all the patterns are not defective.

From a mathematical point of view, a process window is a region in a vector space spanned by all the processing parameters. In a given patterning process (e.g., lithography process), the process window of a pattern is dictated only by the specifications of the pattern and the physics involved in the patterning process. Namely, if the specifications and the physics do not change during the patterning process, the process window does not change.

However, one or more of the processing parameters may not be measurable in a particular patterning process, for example, when the lithography apparatus is not equipped with a sensor that can measure one or more the processing parameters; and one or more of the processing parameters may not be adjustable in a particular patterning process, for example, due to software or hardware limitations. Therefore, using a region in a vector space spanned by all the processing parameters as the process window may not be convenient. A region of a subspace (i.e., a space spanned by fewer than all the processing parameters) ("sub-PW") may be used instead of the region of the space spanned by all the processing parameters ("full PW"). For example, in a patterning process using optical lithography with many processing parameters, a region of the subspace spanned by focus and dose may be used as a sub-PW. The processing parameters spanning the subspace may be all measurable and adjustable. Not all processing parameters that are measurable and adjustable have to be used to span the subspace. In an optical lithography apparatus, the focus and dose are usually adjustable and measurable while other processing parameters such as a characteristic of the deformation of the projection optics (e.g., induced by temperature change of one or more components of the lithography apparatus) may be unmeasurable (i.e., whose value cannot be ascertained or estimated), unadjustable, or both.

Using the sub-PW may be more convenient but the sub-PW may not remain unchanged during the patterning process. This is because those processing parameters not spanning the sub-PW may change during the patterning process. For example, processing parameters may vary with position on a substrate and with time (e.g., between substrates, between dies). Such variation may be caused by change in the environment such as temperature and humidity, intentional adjustment, electrical or mechanical noise, etc. Other causes of such variations may include deformation or drift in one or more components in the patterning process apparatus, such as a projection radiation source, projection optics of a lithography apparatus, a substrate table, height variations of a substrate surface, an illumination slit position variation in a lithography apparatus, etc. Other variations of those processing parameters may include drifts in post-exposure processes (e.g., post-exposure (PEB) time, PEB temperature, PEB temperature profile, chemical composition of a developer, duration and/or temperature of development, gas composition and/or pressure used in etch, power, temperature and/or duration of etch, etc.).

Figure 3:
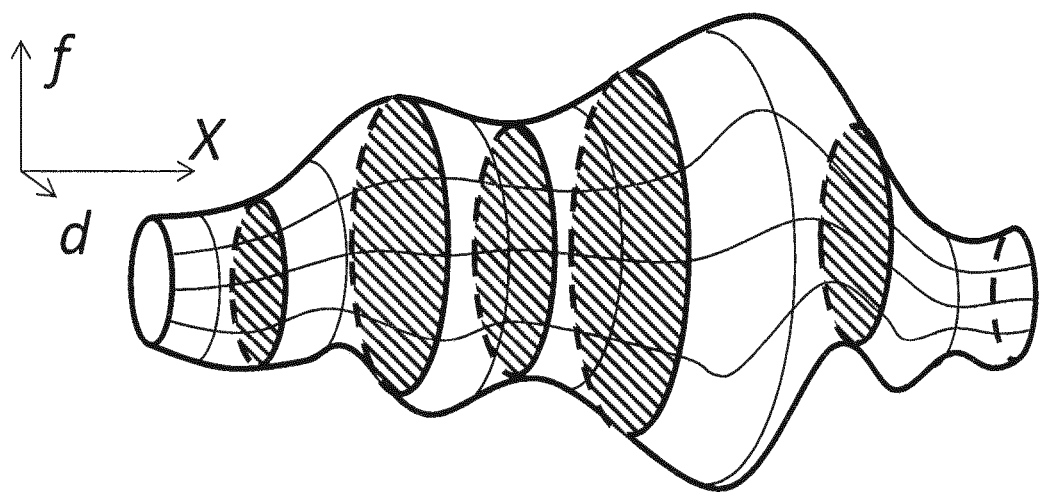
FIG. 3 schematically shows why a sub-process window may not remain unchanged during the patterning process.

FIG. 3 schematically shows why a sub-PW may not remain unchanged during the patterning process. For convenience, the PW is depicted as a region of a three-dimensional (e.g., focus (f), dose (d) and another processing parameter X) space although the PW may actually have many more dimensions. Sub-PWs spanned by two of the processing parameters—focus (f) and dose (d)—are shown as cross-sections of the PW. As the processing parameter X changes during the patterning process for any reason, the sub-PW spanned by f and d—the ranges of f and d under which a pattern will be produced within specifications under the condition of the value of X—may not remain unchanged. This is because the underlying condition of X changes. In order to maintain robustness of the patterning process, the processing parameters spanning the sub-PW (f and d in this example) may be tuned such that their values correspond to a point in the sub-PW away from the boundaries of the sub-PW. The dose may be the "effective dose," which relates to the radiation intensity and exposure duration.

The PW or a sub-PW may not be continuous. For example, the PW or a sub-PW may include two regions not connected to each other. The PW or a sub-PW thus may have one or more boundaries. A boundary of an n-dimensional space is a (n−1)-dimensional space. For example, a boundary of a two-dimensional space (i.e., a surface) is a one-dimensional space (i.e., a curve); a boundary of a three-dimensional space (i.e., a body) is a two-dimensional space (i.e., a surface). To determine whether a given set of values of the processing parameters is inside the PW or a sub-PW of a pattern can be done by determining whether the pattern to be produced under the set of values is within specification.

Physical production of the pattern or simulation thereof may be necessary to determine whether the pattern is within specification. Physical production or simulation may be time-consuming or expensive. Therefore, it may be useful to represent the boundaries of the PW or a sub-PW in terms of the values of the processing parameters. With this representation of the boundaries, to determine whether a given set of values of the processing parameters is inside the PW or a sub-PW can be done by simply comparing the set of values with the values representing the boundaries.

Figure 4:
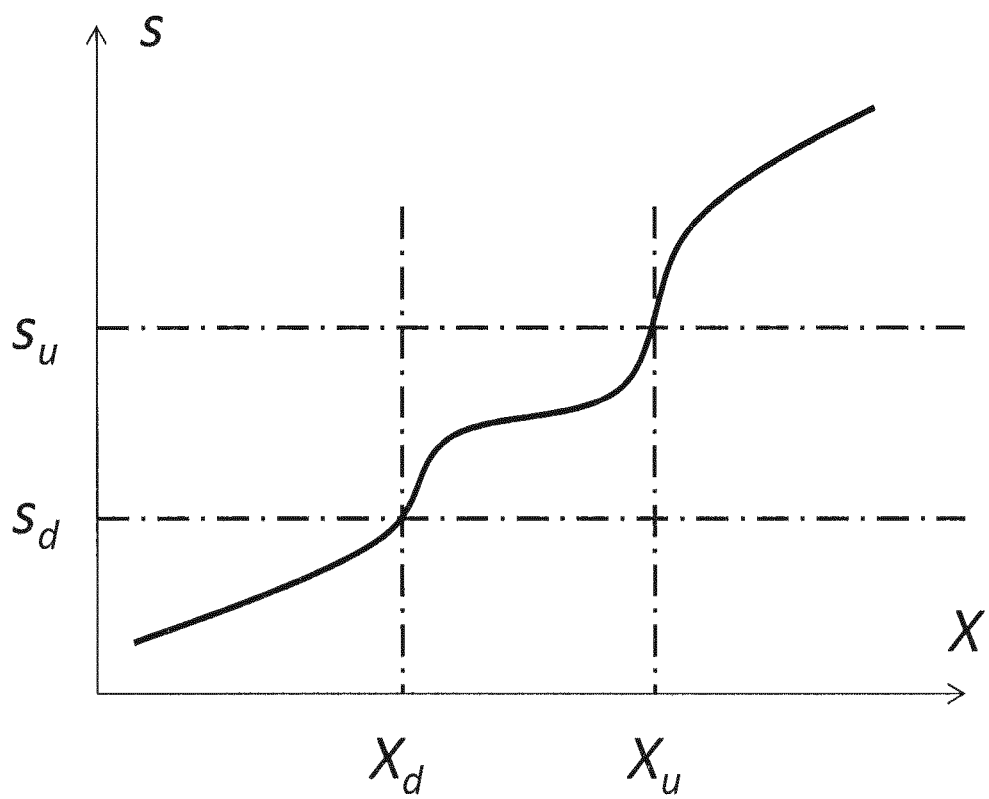
FIG. 4 schematically shows an example of a relationship between a quantity S of the specification as a function of a single processing parameter X.

FIG. 4 shows an example of a relationship between a quantity S of the specification as a function of a single processing parameter X. In this example, the specification provides that the value of S must be from $S_u$ to $S_d$. The boundaries of the one-dimensional sub-PW spanned by X are values $X_u$ and $X_d$, where $S=S_u$ when $X=X_u$ and $S=S_d$ when $X=X_d$.

Figure 5:
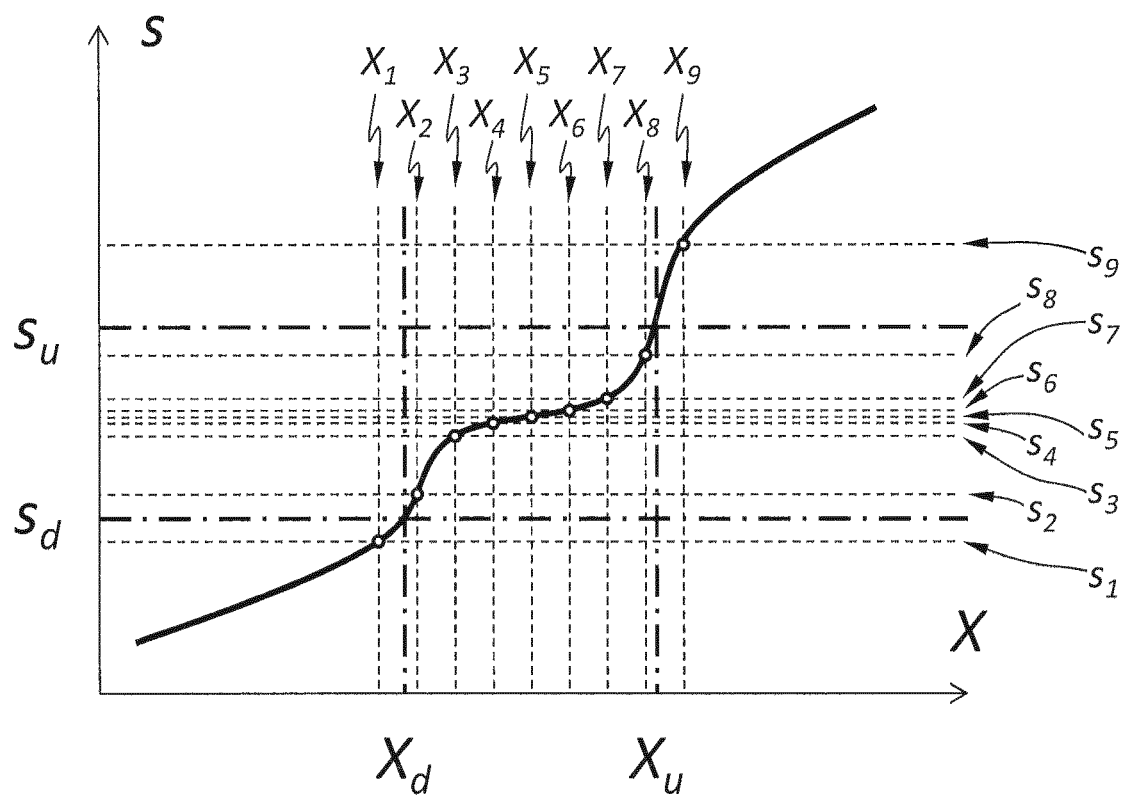
FIG. 5 schematically shows an example of a method of determining the value(s) of the boundary of a process window represented by the quantity S.

FIG. 5 shows an example of a method of determining the values $X_u$ and $X_d$. The values $S_i$ (e.g., $S_1, S_2, \ldots, S_9$) of the quantity S may be obtained at multiple samples X, (e.g., $X_1$, $X_2, \ldots, X_9$) of the processing parameter X, where $S=S_i$ when $X=X_i$. From the values $S_i$, the boundaries represented in terms of X can be estimated. In this example, $S_d$ is between $S_1$ and $S_2$. Therefore, $X_d$ is between $X_1$ and $X_2$. Similarly, $S_u$ is between $S_8$ and $S_9$. Therefore, $X_u$ is between $X_8$ and $X_9$. This method of FIG. 5 can be computationally expensive because many values of S may be required to find a pair between which $S_u$ or $S_d$ falls.

Figure 6:
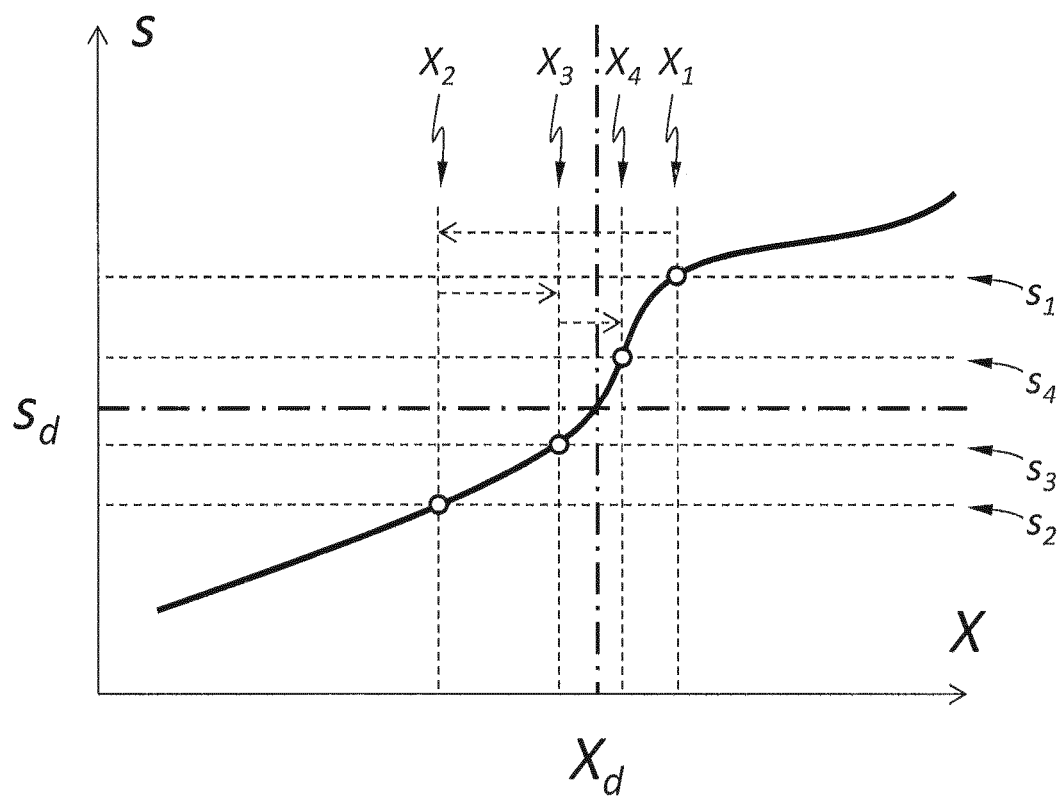
FIG. 6 schematically shows an example of a method of finding a representation of a boundary of a process window in terms of the value(s) of one or more processing parameters, according to an embodiment.

FIG. 6 shows an example of a method of finding a representation of a boundary (e.g., $S_d$) of the PW or a sub-PW in terms of the values of the processing parameter, according to an embodiment. An initial value $X_1$ of the processing parameter X is selected. The initial value $X_1$ may be a value that is known empirically to be near the boundary. The initial value $X_1$ may also be a value derived by simulation. The value $S_1$ of the quantity S when $X=X_1$ is obtained. The value $S_1$ may be obtained by experiment or simulation. $S_1$ is then compared with the boundary $S_d$ represented by the value of S. The second value $X_2$ of the processing parameter X is then selected. The second value $X_2$ may be selected based on the first value $X_1$, the value $S_1$, the boundary represented by the value of S (e.g., $S_d$), empirical data, experimental data, or a combination thereof. As an example, the second value $X_2$ may be a pre-defined value added or subtracted from $X_1$ (e.g., if X represents focus, then the pre-defined value may be a value in the range from 1-5 nm, 1-10 nm, 1-15 nm or 1-20 nm focus difference). The value $S_2$ of the quantity S when $X=X_2$ is obtained. The value $S_2$ may be obtained by experiment or simulation. The third value $X_3$ of the processing parameter X may be selected based on the first value $X_1$, the value $S_1$, the value $X_2$, the value $S_2$, the boundary represented by the value of S (e.g., $S_d$), empirical data, experimental data, or a combination thereof. The third value $X_3$ may be selected based on the values $X_1$ and $X_2$, and/or the values of $S_1$, $S_2$, and/or $S_d$. For example, $X_3$ may be selected by interpolation on or extrapolation from a path (e.g., a straight line or a curve) connecting the points $(X_1, S_1)$ and $(X_2, S_2)$. In an embodiment, the interpolation or extrapolation may be to a point X where S is equal to $S_d$. Further values $X_{(n+1)}$, (e.g., $X_4$) of the processing parameter X may be selected by the immediately prior two or more values $X_{(n-1)}$ and $X_n$ of X, and/or the values $S_{(n-1)}$ and $S_n$ of S at $X_{(n-1)}$ and $X_n$ (using one or more of the techniques described above to arrive at $X_3$) until a terminal criterion is met. One such criterion is that the difference $(X_{(n+1)}-X_n)$ between the immediately prior two values of the value of X is less than a threshold. Another such criterion is that the difference $(S_{(n+1)}-S_d)$ between the value of S at $X_{(n+1)}$ and the boundary represented by S (e.g., $S_d$) is within a threshold. The last value of X approximately represents the boundary (e.g., $X_d$). This method is not limited to a representation of a boundary by the values of a single processing parameter. For example, if the boundary S is to be represented by three processing parameters X, Y and Z, the values $X_{(n+1)}$, $Y_{(n+1)}$ and $Z_{(n+1)}$ may be selected based on the values $X_n$, $Y_n$, $Z_n$, $X_{(n-1)}$, $Y_{(n-1)}$ and $Z_{(n-1)}$ and the values $S_{(n-1)}$ and $S_n$ of S at $\{X_{(n-1)}, Y_{(n-1)}, Z_{(n-1)}\}$ and $\{X_n, Y_n, Z_n\}$.

Figure 7:
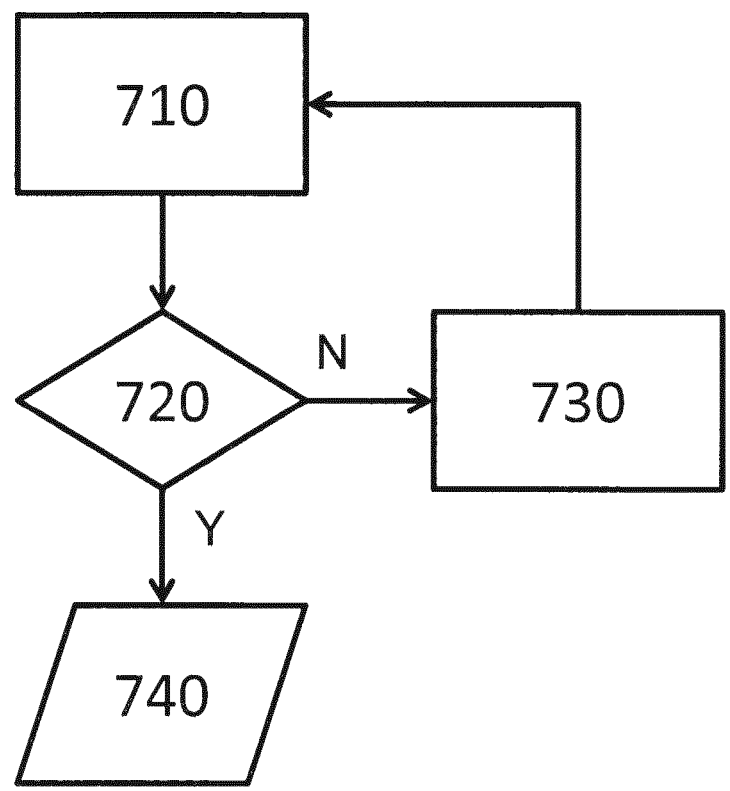
FIG. 7 schematically shows a flow chart for a method of finding a representation of a target value of a characteristic of a patterning process or a product thereof in terms of the value(s) of one or more processing parameters, according to an embodiment.

FIG. 7 schematically shows a flow chart for a method of finding a target value (e.g., the target value is a boundary of the PW or a sub-PW) of a characteristic (e.g., quantity S) of a patterning process (e.g., a device manufacturing process) or a product thereof in terms of the values of one or more processing parameters, according to an embodiment. Namely, the method finds the values of the one or more processing parameters at which the characteristic has the target value. In 710, the value of the characteristic at a current value of the one or more processing parameters (e.g., X, Y and Z in FIG. 6) is determined. The current value may be a selected suitable initial value or a subsequent value as provided in 730. The characteristic is not limited to a boundary of a process window. In 720, it is determined whether a termination criterion is met by the value of the characteristic at the current value of the one or more processing parameters. An example of the termination criterion may include that the value of the characteristic at the current value of the one or more processing parameter is within a predetermined range from the target value (e.g., within a numerical value (within the range of 1-2 nm, 1-3 nm, 1-4 nm, 1-5 nm, or 1-10 nm), or the value of the characteristic hasn't changed by a threshold percentage from a previous value of the characteristic (e.g., no more than 0.5% change, no more than 1% change, no more than 5% change, or no more than 10% change). If the termination criterion is met, the current value 740 of the one or more processing parameters is provided as an approximation of the representation of the target value, where the representation is a value of the processing parameter at which the characteristic has a target value. If the termination criterion is not met, the flow goes to 730 where a new value of the one or more processing parameters is determined from the current or a prior value of the one or more processing parameters and/or the value of the characteristic at the current value of the one or more processing parameters and the value of the characteristic at a prior value of the one or more processing parameters; the one or more processing parameters are set to the new value(s) and the flow goes back to 710.

Figure 8:
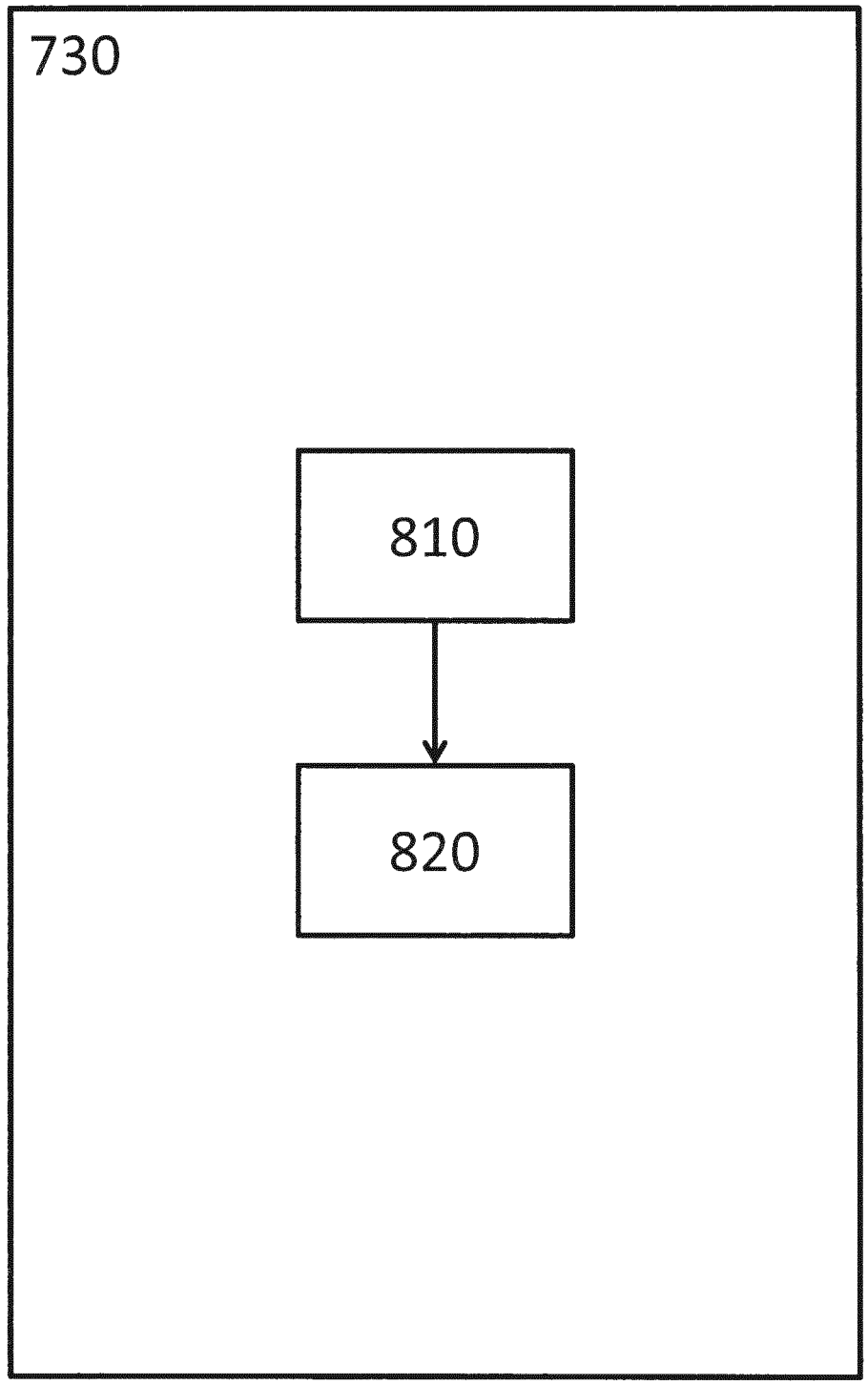
FIG. 8 schematically shows a flow chart for one way the new value(s) of the one or more processing parameters are determined in 730 of FIG. 7.

FIG. 8 schematically shows a flow chart for one way a new value of the one or more processing parameters is determined in 730. In 810, a step (e.g., including both magnitude and direction) of the one or more processing parameters may be determined from a current value or a prior value of the one or more processing parameters, and/or may be determined from the value of the characteristic at the current value of the one or more processing parameters and/or the value of the characteristic at a prior value of the one or more processing parameters. Additionally or alternatively, the step may be fixed or varying. For example, the step may be a pre-defined value added or subtracted from a current value of the one or more processing parameter (e.g., if the processing parameter comprises focus, then the pre-defined value may be a value in the range from 1-5 nm, 1-10 nm, 1-15 nm or 1-20 nm focus difference). In an embodiment, the step may vary over iterations. For example, step may decrease in value for each iteration or select number of iterations. In 820, the new value of the one or more processing parameters is determined by combining the current value with the step.

Figure 9:
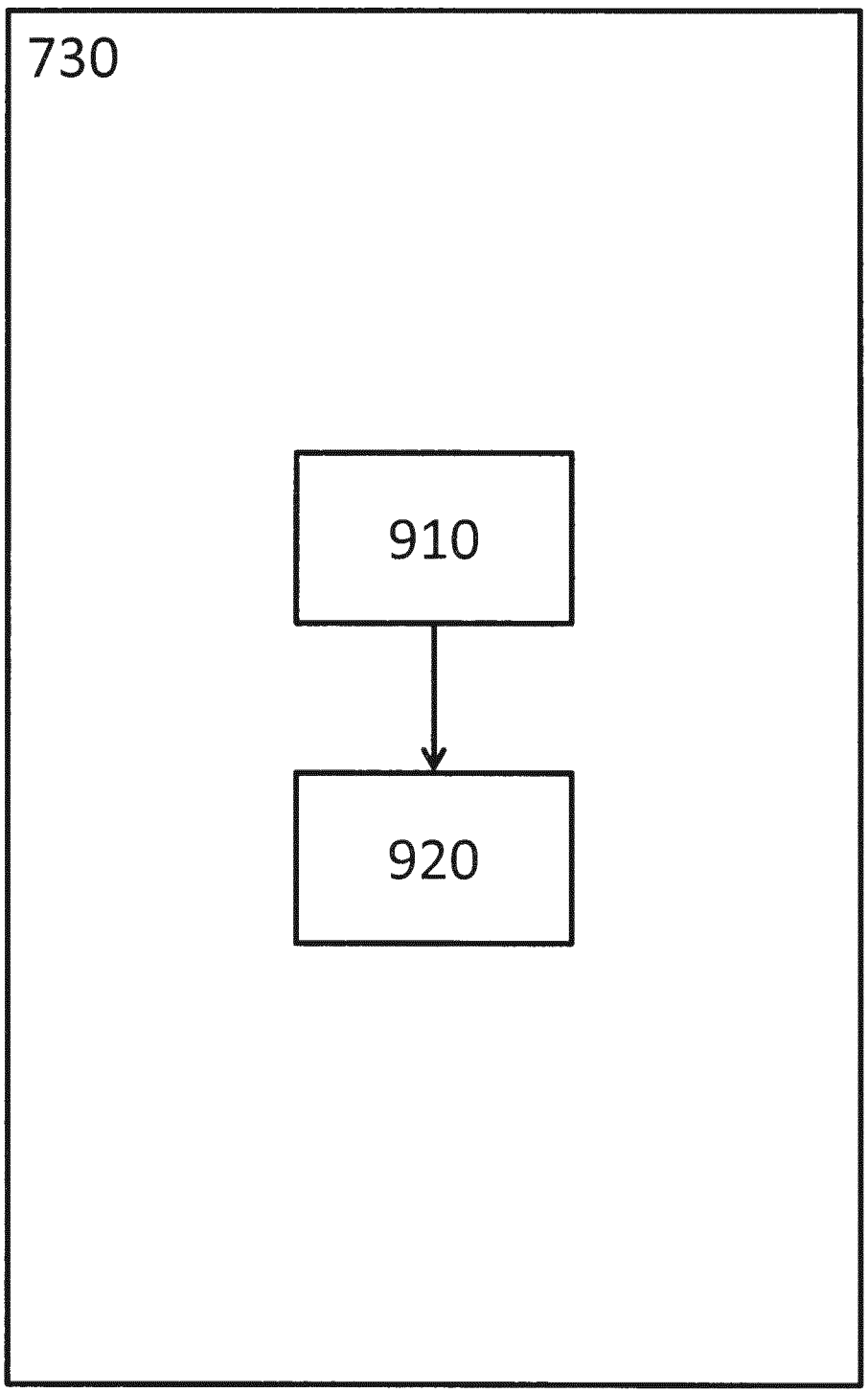
FIG. 9 schematically shows a flow chart for one way the new value(s) of the one or more processing parameters are determined in 730 of FIG. 7.

FIG. 9 schematically shows a flow chart for one way a new value of the one or more processing parameters is determined in 730. In 910, the values $S_{(n-1)}$ and $S_n$ of the characteristic respectively at the prior value $X_{(n-1)}$ immediately prior to the current value $X_n$ and at the current value $X_n$ of the one or more processing parameters are determined. In 920, a new value $X_{(n+1)}$ is obtained by extrapolation or interpolation from the values $S_{(n-1)}$, $S_n$ and the target value. For example, the new value $X_{(n+1)}$ may be the value of X at an extrapolation from or interpolation within $S_{(n-1)}$, $S_n$ to the target value $S_d$. The interpolation or extrapolation is not limited to linear interpolation or linear extrapolation.

Figure 10:
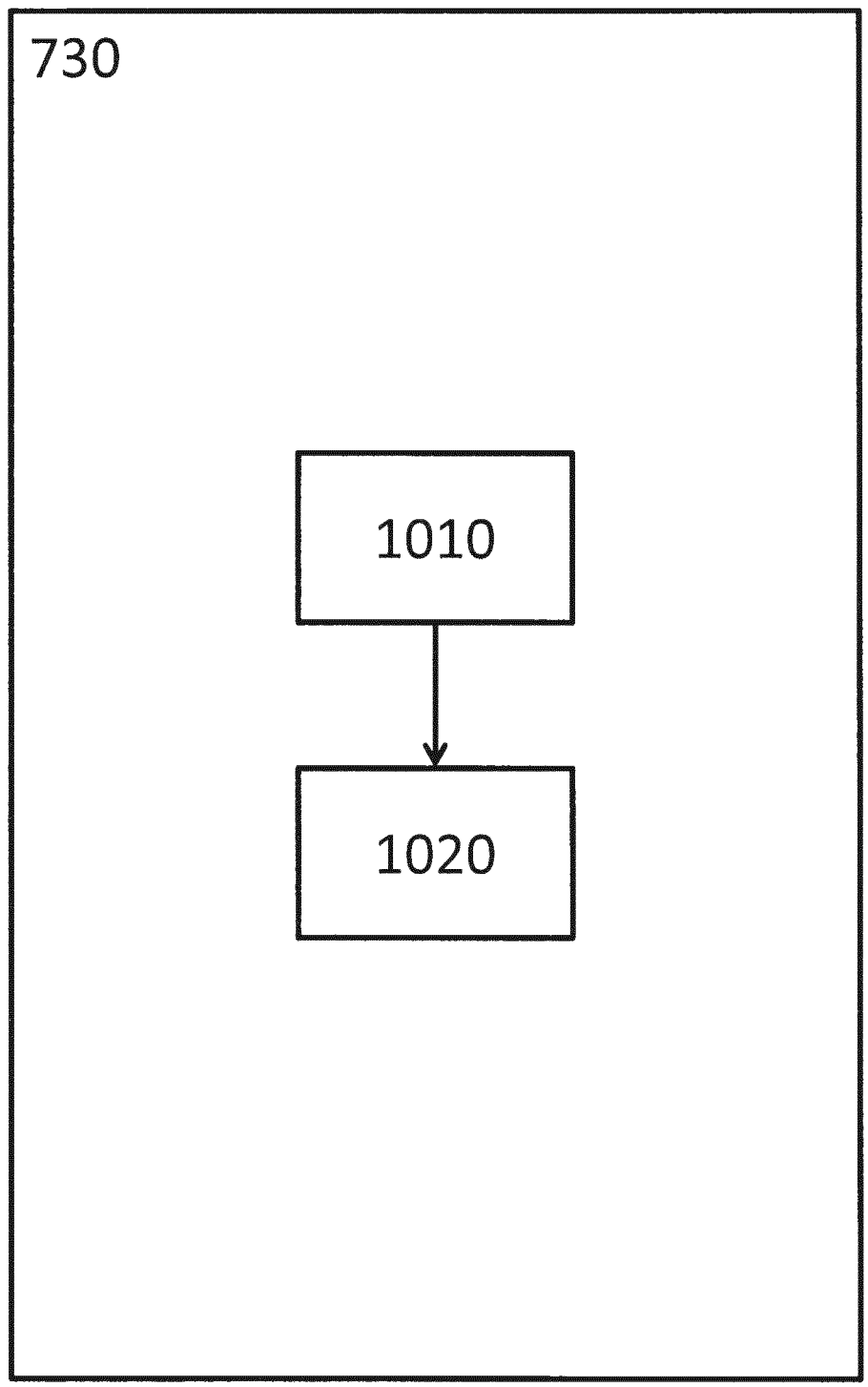
FIG. 10 schematically shows a flow chart for one way the new value(s) of the one or more processing parameters are determined in 730 of FIG. 7.

FIG. 10 schematically shows a flow chart for one way a new value of the one or more processing parameters is determined in 730. In 1010, the prior value $X_{(n-1)}$ immediately prior to the current value $X_n$ and at the current value $X_n$ of the one or more processing parameter are obtained. In 1020, a new value $X_{(n+1)}$ of the one or more processing parameters is determined by an affine combination of $X_{(n-1)}$ and $X_n$, such as $(1-t)X_{(n-1)}+tX_n$, where t is a constant such as 0.5.

The ways in which a new value of the one or more processing parameters is determined in 730 may be combined. For example, a first iteration (or number of iterations) may use one way and further iterations may use another way. For example, the step of FIG. 8 may be used for a first iteration (i.e., to determine a second current value) and the ways of FIGS. 9 and/or 10 may be used for subsequent iterations.

Figure 11:
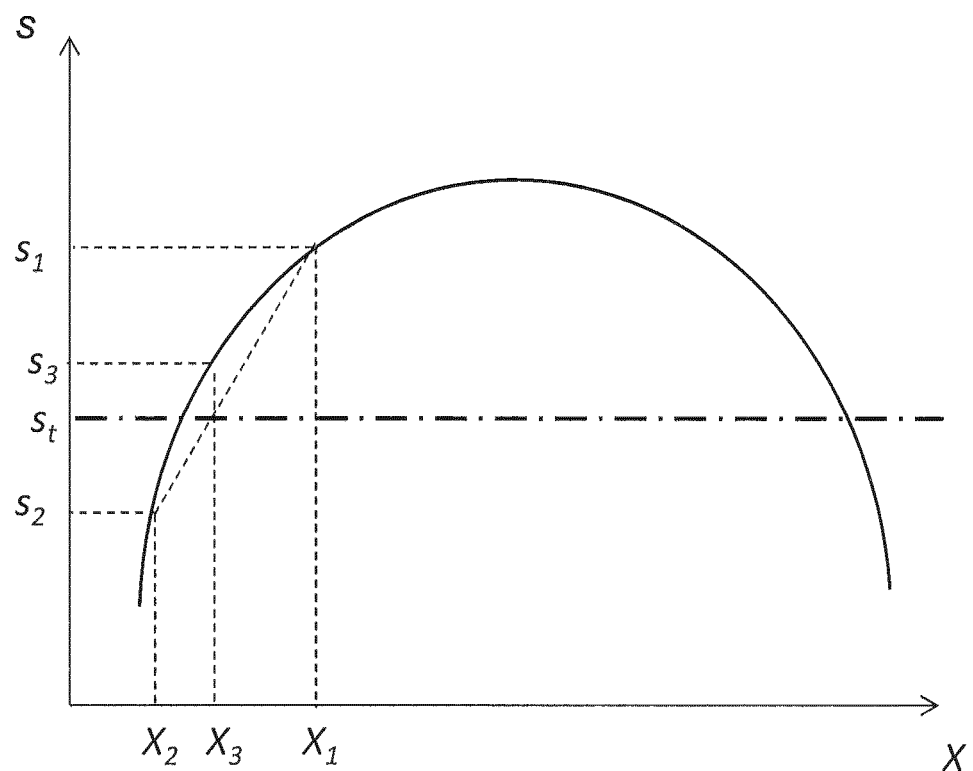
FIG. 11 schematically shows an example of a method of finding a representation of a boundary of a process window in terms of the value(s) of one or more processing parameters, according to an embodiment.

So, rather than simulating or measurement over a wide range of values of one or more processing parameters (e.g., focus conditions) at a fine interval to identify the process window boundary, the technique herein provides for iteration, sparse sampling and fitting to quickly converge on the process window boundary reliably. That is, there is provided an iterative processing parameter boundary search using sparse conditions for quick determination of a process window of the processing parameter. So, referring to FIG. 11 and considering an embodiment where the processing parameter X is focus, the characteristic S of the patterning process is critical dimension and the values are obtained by simulation, the boundary (or process window) condition is defined as the focus condition at which the worst simulated pattern size (e.g., wherein S is CD) equals a user-defined detector threshold (e.g., where $S_t$ is a threshold CD), as shown in FIG. 11. An initial focus condition $X_1$ is used to determine the worst simulated pattern size $S_1$ for that focus condition (in FIG. 11, a curve is shown for the worst simulated pattern size S as a function of focus condition X merely to aid explanation and show how the worst simulated pattern size S behaves as a function of focus condition X; to arrive at each of the points on the curve would require numerous simulations and are not required using the technique as described herein which will arrive at the value(s) of the processing parameter X for $S_t$ in a limited number of iterations). If the simulated size does not match the detector threshold $S_t$ (or within a user-defined range) as shown in FIG. 11, simulation is performed to arrive at worst simulated pattern size S at a new focus condition $X_2$ which can be determined by, e.g., the difference between the detector threshold and the simulated size, by a fitting such as extrapolation or interpolation (e.g., linear fitting) or other technique as described above (e.g., a step). An example of the fitting is shown in FIG. 11 for a new focus condition $X_3$ which is obtained by linearly interpolating between $X_1$ and $X_2$ in conjunction with the values $S_1$ and $S_2$ at those values of X. The new focus condition $X_3$ is used as an input to the simulation to arrive at new values $S_3$ for comparison with $S_t$. This process is repeated until a convergence criterion (e.g. worst simulated pattern size is the same as the threshold) is met and the final one or more focus conditions will be the process window/boundary. Thus, only a relatively few number of iterations (e.g., 10 or fewer, or 5 or fewer) are used to locate the process window, and the computing time used scales roughly linearly with the number of iterations used.

Further, knowing which one or more patterns will become defective before others when the patterning process deviates out of the PW or sub-PW can be useful. For example, these one or more patterns can be monitored more closely or adjustments to the patterning process can be made to make these one or more patterns more tolerant to process deviation. After a representation of a boundary of the PW or a sub-PW in terms of the values of the one or more processing parameters is found (e.g., using one of the methods disclosed herein), the representation may be used to identify these one or more patterns.

Figure 12:
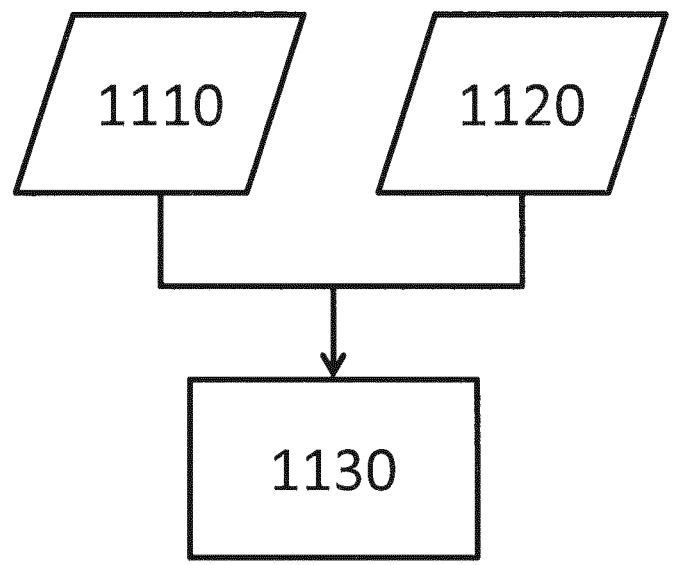
FIG. 12 schematically shows a flow chart for a method of identifying one or more patterns that have risk of being defective when the patterning process deviates out of a process window.

FIG. 12 schematically shows a flow chart for a method of identifying one or more patterns that have risk of being defective when the patterning process deviates out of the PW or sub-PW. In 1110, the value X* of the one or more processing parameters X representing a boundary of the PW or a sub-PW is obtained, for example, using a method disclosed herein. Namely, when the one or more processing parameters X are at the value X*, the patterning process is at a boundary of the PW or the sub-PW. In 1120, a deviation $\Delta$ of the one or more processing parameters X is obtained. The deviation $\Delta$ can be obtained empirically or experimentally. The deviation $\Delta$ can represent a magnitude of variation of the value of X during the patterning process due to many factors such as temperature variation, mechanical variation, stochastic effects, illumination intensity variation, etc. In 1120, a value of an indicator is determined for each of the patterns, the indicator characterizing the difference of a characteristic C of each of the patterns within X* to X*+$\Delta$. Examples of the indicator include $(C|_{X=X^*+\Delta} - C|_{X=X^*})$, or $$\frac{\partial C}{\partial X}\bigg|_{X=X^*},$$

where C is a quantity of the specification for the patterns. Other examples of the indicator include $\int P(\Delta)(C|_{X=X^*+\Delta} - C|_{X=X^*})$. In 1130, the one or more patterns that have a risk of being defective when the patterning process deviates out of the PW or sub-PW are identified based on the value of the indicator. For example, the values of the indicator may be ranked and the one or more patterns with the highest or lowest values are identified. For example, the top or bottom 5%, 10%, 15% or 20% may be identified.

So, for example, referring to an example where the processing parameter is focus and the process window boundary is defined, a pre-defined focus range A from the boundary (the range is the "focus boundary zone" within which all focus-limiting hot spots occur) is specified. At the new condition (the far end of the "focus boundary zone"), all the defects up to the detector threshold are determined. This helps ensure capture of all hot spots of interest that occur in the "focus boundary zone". The number of hot spots captured on, for example, a full device layout can be very large (e.g., on the order of hundreds of thousands to millions). Thus it is desirable to be able to evaluate (e.g., rank) these hot spots to identify their susceptibility to failing (e.g., rank in the order of their susceptibility to fail).

Figure 13:
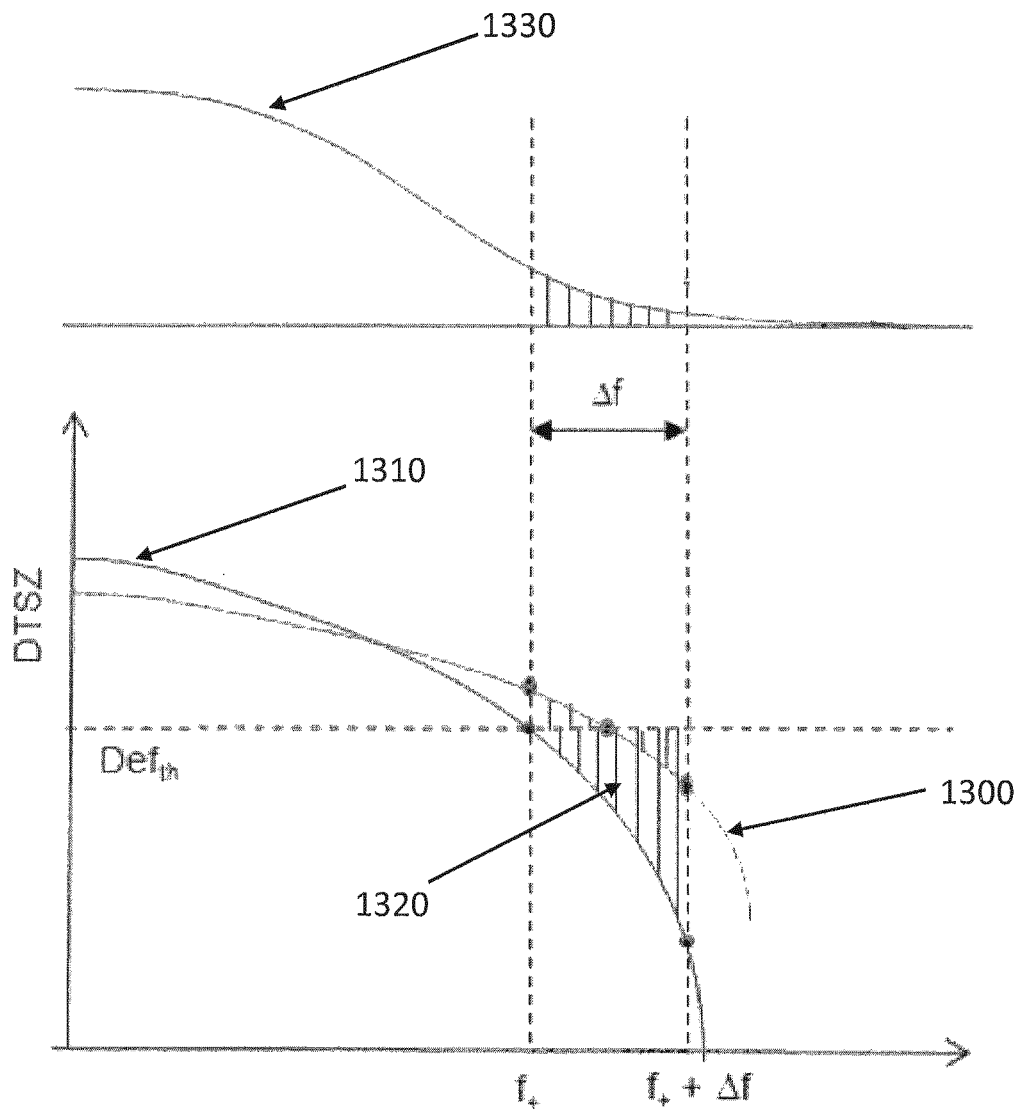
FIG. 13 schematically shows a weighted approach to identifying certain hot spots.

Referring to FIG. 13, to do so, in an embodiment, a statistical weighted approach can be used. Both the rate at which the detector threshold size DTSZ (e.g., CD) is changing with respect to focus and the process window of a particular hot spot are calculated. FIG. 13 shows the curve 1300 for hot spots HS, and the curve 1310 for the most limiting hot spots. The focus conditions used for this calculation are from the focus boundary $f_+$ up to a predetermined focus range, $\Delta f$. In an embodiment, this focus range is related to the amount of focus uncertainty that occurs during an exposure by the lithography apparatus. The most likely printed condition is then calculated by weighting the focus uncertainty (e.g., a Gaussian distribution) with respect to the slope of the detector threshold size and the process window, and used to rank the hot spots. Referring to FIG. 13, the concerning hot spots are in the region 1320 below the detector threshold $Def_{th}$ and curve 1330 shows an example of statistical weighting function based on focus uncertainty. Curve 1330 shows a Gaussian distribution of focus value probability, but in principle other types of functions can be applied to achieve accurate ranking So, a statistically weighted approach may be provided to determine the seriousness or propensity to fail of a hot spot by weighting the rate at which the detector (e.g., CD) changes with respect to focus and the process window (the focus condition whereby it crosses the detector threshold $Def_{th}$). A normalized version may be applied, for example, when there are multiple detector thresholds being used. And so, in an embodiment, there is provided a methodology and associated conditions to capture all desired limiting hot-spots for a given process parameters value and then a statistical ranking of the one or more limiting hot spots based on process window, focus uncertainty and rate of change with respect to focus is provided.

Figure 14:
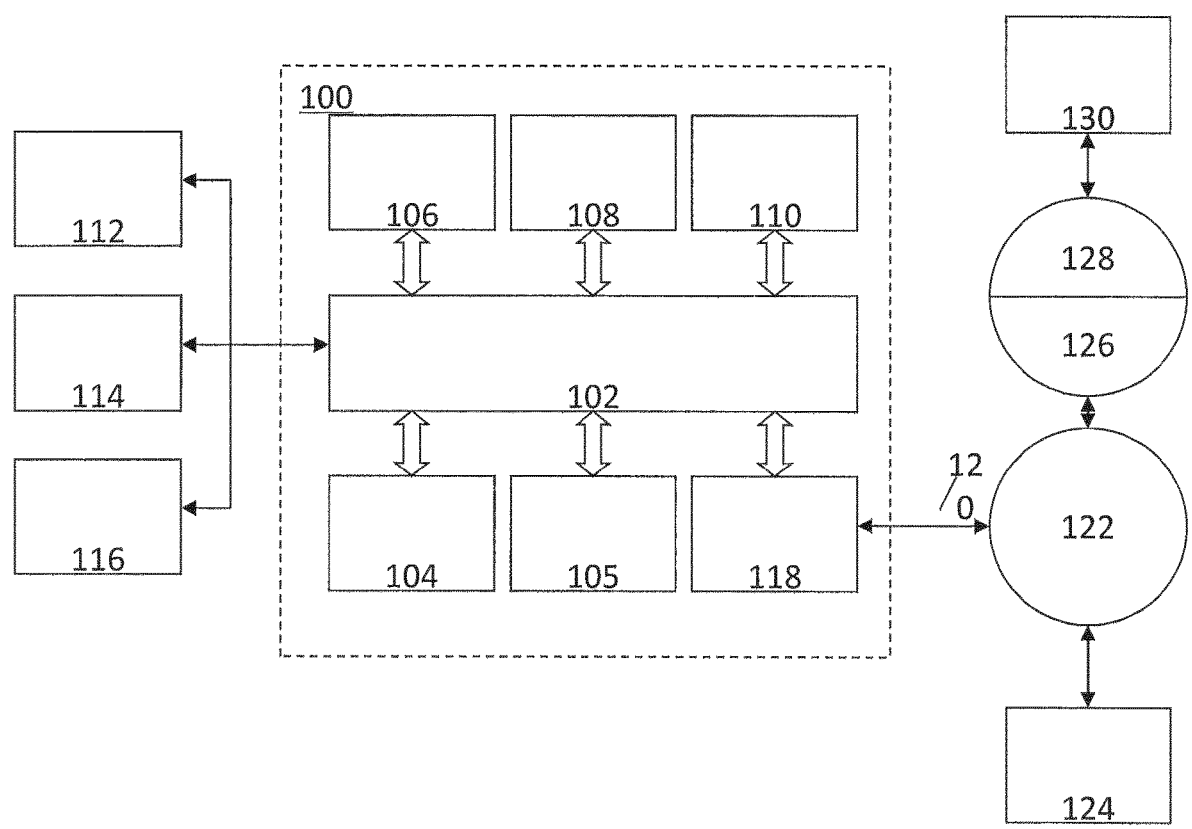
FIG. 14 is a block diagram of an example computer system.

FIG. 14 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to a processor for execution. Similarly, a machine-readable medium may include any mechanism for storing or transmitting information in a form readable by a machine (e.g., a computing device). Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of radiation waves, such as those generated during radio frequency (RF) and infrared (IR) data communications. Common forms of machine- or computer-readable media include, for example, a floppy disk, a flexible disk, hard disk, magnetic tape, any other magnetic medium, a CD-ROM, DVD, any other optical medium, flash memory devices, punch cards, paper tape, any other physical medium with patterns of holes, a read only memory (ROM), random access memory (RAM), a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

The invention may further be described using the following clauses:

1. A method comprising:
determining a value of a characteristic of a patterning process or a product thereof, at a current value of a processing parameter;
determining whether a termination criterion is met by the value of the characteristic;
if the termination criterion is not met, determining, by a computer, a new value of the processing parameter from the current value of the processing parameter and a prior value of the processing parameter, and setting the current value to the new value and repeating the determining steps; and
if the termination criterion is met, providing the current value of the processing parameter as an approximation of a value of the processing parameter at which the characteristic has a target value.

2. The method of clause 1, further comprising selecting an initial value of the processing parameter.

3. The method of clause 1 or clause 2, wherein the target value represents a boundary of a process window (PW) or a sub-process window (sub-PW).

4. The method of any of clauses 1 to 3, wherein the termination criterion is that the value of the characteristic at the current value of the processing parameter is within a certain range from the target value.

5. The method of any of clauses 1 to 4, wherein the new value is determined from the value of the characteristic at the current value of the processing parameter and the value of the characteristic at the prior value of the processing parameter.

6. The method of any of clauses 1 to 5, wherein determining the new value comprises:
determining a step of the processing parameter from the current value or the prior value of the processing parameter, and from the value of the characteristic at the current value or at the prior value of the processing parameter; and
determining the new value by combining the current value with the step.

7. The method of any of clauses 1 to 5, wherein determining the new value comprises:
determining values of the characteristic at the prior value of the processing parameter and at the current value of the processing parameter; and
determining the new value by extrapolation or interpolation from the values of the characteristic at the prior value of the processing parameter and at the current value of the processing parameter, and from the target value.

8. The method of any of clauses 1 to 5, wherein determining the new value comprises determining the new value by an affine combination of the prior value of the processing parameter and the current value of the processing parameter.

9. The method of any of clauses 1 to 8, wherein the characteristic comprises critical dimension and the processing parameter comprises focus.

10. A method comprising:
obtaining a value of a processing parameter of a patterning process, wherein at the value of the processing parameter, the patterning process is at a boundary of a process window;
obtaining a deviation of the processing parameter;
determining a value of an indicator for each of a plurality of patterns, the value of the indicator characterizing a change of a characteristic of each of the patterns within the value of the processing parameter to the value of the processing parameter combined with the deviation; and
identifying, by a computer, one or more patterns having a risk of being defective among the plurality of patterns based on the value of the indicator.

11. The method of clause 10, wherein the deviation represents a magnitude of variation of values of the processing parameter during the patterning process.

12. The method of clause 10 or clause 11, wherein the indicator is a difference of a value of the characteristic at the value of the processing parameter combined with the deviation and a value of the characteristic at the value of the processing parameter.

13. The method of clause 10 or clause 11, wherein the indicator is a derivative of the characteristic with respect to the processing parameter.

14. The method of clause 10 or clause 11, wherein the indicator is an integral of a product of a change of the processing parameter from the value of the processing parameter combined with the deviation to the value of the processing parameter and a probability of the deviation.

15. A computer program product comprising a computer readable medium having instructions recorded thereon, the instructions when executed by a computer implementing the method of any of clauses 1 to 14.

Embodiments of the disclosure may be implemented in hardware, firmware, software, or any combination thereof. Embodiments of the disclosure may also be implemented as instructions stored on a machine-readable medium, which may be read and executed by one or more processors. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the disclosure have been described above, it will be appreciated that the embodiments may be practiced otherwise than as described.

The invention claimed is:

1. A method comprising:
   obtaining a value of a characteristic of a patterning process or a product thereof, at a current value of a processing parameter;
   determining, by a hardware computer, a new value of the processing parameter from the current value of the processing parameter and a prior value of the processing parameter, and setting the current value to the new value and repeating the obtaining and determining steps, wherein the determining the new value comprises inputting data associated with each of the current and prior values to a function or comprises determining a step of the processing parameter based on data associated with the current value and/or prior value; and
   providing the current value of the processing parameter as an approximation of a value of the processing parameter at which the characteristic has a target value,
   wherein the target value represents a boundary of a process window (PW) or a sub-process window (sub-PW).

2. The method of claim 1, further comprising selecting an initial value of the processing parameter.

3. The method of claim 1, wherein the repeating the determining is performed until the value of the characteristic at the current value of the processing parameter is within a certain range from the target value.

4. The method of claim 1, wherein the new value is determined from the value of the characteristic at the current value of the processing parameter and the value of the characteristic at the prior value of the processing parameter.

5. The method of claim 1, wherein determining the new value comprises:
   determining the step of the processing parameter from the current value or the prior value of the processing parameter, and/or from the value of the characteristic at the current value or at the prior value of the processing parameter; and
   determining the new value by combining the current value with the step.

6. The method of claim 1, wherein determining the new value comprises:
   determining values of the characteristic at the prior value of the processing parameter and at the current value of the processing parameter; and
   inputting the values of the characteristic to an extrapolation or interpolation function to determine the new value by extrapolation or interpolation from the values of the characteristic at the prior value of the processing parameter and at the current value of the processing parameter, and from the target value.

7. The method of claim 1, wherein determining the new value comprises inputting the values of the characteristic to an affine combination function to determine the new value by an affine combination of the prior value of the processing parameter and the current value of the processing parameter.

8. The method of claim 1, wherein the characteristic comprises critical dimension and the processing parameter comprises focus.

9. A computer program product comprising a non-transitory computer readable medium having instructions therein, the instructions, when executed by a computer system, are configured to cause the computer system to at least:
   obtain a value of a characteristic of a patterning process or a product thereof, at a current value of a processing parameter;
   determine whether a criterion is met by the value of the characteristic;
   responsive to the criterion not being met, determine a new value of the processing parameter from the current value of the processing parameter and a prior value of the processing parameter, and set the current value to the new value and repeat the obtaining of a value of the characteristic and the determination of whether the criterion is met by the value of the characteristic, wherein the determination of the new value comprises input of data associated with each of the current and prior values to a function or comprises determination of a step of the processing parameter based on data associated with the current value and/or prior value; and
   responsive to the criterion being met, provide the current value of the processing parameter as an approximation of a value of the processing parameter at which the characteristic has a target value,
   wherein the target value represents a boundary of a process window (PW) or a sub-process window (sub-PW).

10. The computer program product of claim 9, wherein the criterion is that the value of the characteristic at the current value of the processing parameter is within a certain range from the target value.

11. The computer program product of claim 9, wherein the new value is determined from the value of the characteristic at the current value of the processing parameter and the value of the characteristic at the prior value of the processing parameter.

12. The computer program product of claim 9, wherein the instructions configured to determine the new value are further configured to:
   determine the step of the processing parameter from the current value or the prior value of the processing parameter, and/or from the value of the characteristic at the current value or at the prior value of the processing parameter; and
   determine the new value by combining the current value with the step.

13. The computer program product of claim 9, wherein the instructions configured to determine the new value are further configured to:
   determine values of the characteristic at the prior value of the processing parameter and at the current value of the processing parameter; and
   input the values of the characteristic to an extrapolation or interpolation function to determine the new value by extrapolation or interpolation from the values of the characteristic at the prior value of the processing parameter and at the current value of the processing parameter, and from the target value.

14. The computer program product of claim 9, wherein the instructions configured to determine the new value are further configured to input data associated with each of the current and prior values to an affine combination function to determine the new value by an affine combination of the prior value of the processing parameter and the current value of the processing parameter.

15. A computer program product comprising a non-transitory computer readable medium having instructions therein, the instructions, when executed by a computer system, are configured to cause the computer system to at least:
- obtain a value of a characteristic of a patterning process or a product thereof, at a current value of a processing parameter;
- determine a new value of the processing parameter from the current value of the processing parameter and a prior value of the processing parameter, and set the current value to the new value and repeat the obtaining of a value of the characteristic, wherein the determination of the new value comprises input of data associated with each of the current and prior values to a function or comprises determination of a step of the processing parameter based on data associated with the current value and/or prior value; and
- provide the current value of the processing parameter as an approximation of a value of the processing parameter at which the characteristic has a target value that represents a boundary of a process window (PW) or a sub-process window (sub-PW).

16. The computer program product of claim 15, wherein the instructions configured to provide the current value of the processing parameter are further configured to do so at a point when the value of the characteristic at the current value of the processing parameter is within a certain range from the target value.

17. The computer program product of claim 15, wherein the new value is determined from the value of the characteristic at the current value of the processing parameter and the value of the characteristic at the prior value of the processing parameter.

18. The computer program product of claim 15, wherein the instructions configured to determine the new value are further configured to:
- determine the step of the processing parameter from the current value or the prior value of the processing parameter, and/or from the value of the characteristic at the current value or at the prior value of the processing parameter; and
- determine the new value by combining the current value with the step.

19. The computer program product of claim 15, wherein the instructions configured to determine the new value are further configured to:
- determine values of the characteristic at the prior value of the processing parameter and at the current value of the processing parameter; and
- input the values of the characteristic to an extrapolation or interpolation function to determine the new value by extrapolation or interpolation from the values of the characteristic at the prior value of the processing parameter and at the current value of the processing parameter, and from the target value.

20. The computer program product of claim 15, wherein the instructions configured to determine the new value are further configured to input data associated with each of the current and prior values to an affine combination function to determine the new value by an affine combination of the prior value of the processing parameter and the current value of the processing parameter.

\* \* \* \* \*